(12) United States Patent
Kondo et al.

(10) Patent No.: US 7,993,458 B2
(45) Date of Patent: Aug. 9, 2011

(54) VACUUM PROCESSING APPARATUS AND METHOD

(75) Inventors: Masaki Kondo, Nirasaki (JP); Teruyuki Hayashi, Nirasaki (JP); Misako Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/169,660

(22) Filed: Jul. 9, 2008

(65) Prior Publication Data

US 2008/0274288 A1 Nov. 6, 2008

Related U.S. Application Data

(63) Continuation of application No. PCT/JP2007/050271, filed on Jan. 11, 2007.

(30) Foreign Application Priority Data

Jan. 13, 2006 (JP) ................................. 2006-006032

(51) Int. Cl.
*C23C 16/00* (2006.01)
*H01L 21/306* (2006.01)
*C23F 1/00* (2006.01)

(52) U.S. Cl. .............. 118/719; 156/345.31; 156/345.32; 414/939

(58) Field of Classification Search .................. 118/719; 156/345.31, 345.32; 414/935–941
See application file for complete search history.

(56) References Cited

U.S. PATENT DOCUMENTS

| 6,510,365 | B1 | 1/2003 | Nishinakayama et al. |
| 6,828,235 | B2 * | 12/2004 | Takano .................... 438/680 |
| 2003/0209322 | A1 * | 11/2003 | Pfeiffer et al. ........... 156/345.26 |
| 2006/0021575 | A1 | 2/2006 | Ishizawa et al. |

FOREIGN PATENT DOCUMENTS

| CN | 1669136 A | 9/2005 |
| JP | 3-87386 | 4/1991 |
| JP | 2000-127069 | 5/2000 |
| JP | 2003-017478 | 1/2003 |
| JP | 2003-297760 | 10/2003 |
| JP | 2005-200680 | 7/2005 |
| TW | 485531 | 5/2002 |

OTHER PUBLICATIONS

Office Action issued Oct. 29, 2010, in China Patent Application No. 200780000117.8, mailing date Oct. 29, 2010 (with English language Translation).

\* cited by examiner

*Primary Examiner* — Karla Moore

(74) *Attorney, Agent, or Firm* — Oblon, Spivak, McClelland, Maier & Neustadt, L.L.P.

(57) ABSTRACT

A gas exhaust unit evacuates the inside of a vacuum transfer chamber at a constant exhaust rate. An gas exhaust valve is kept normally open, and a purge gas ($N_2$ gas) is supplied from a purge gas supply source into the vacuum transfer chamber via a mass flow controller (MFC) and an opening/closing valve. A main control unit controls a pressure in the vacuum transfer chamber to be within a specified range through a flow rate set value for the MFC while monitoring a pressure in the vacuum transfer chamber via a vacuum gauge. The main control unit determines occurrence of abnormality when the pressure exceeds a specified upper limit and then takes such actions as changing a flow rate set value for the MFC, giving an alarm and stopping the operation of a vacuum processing apparatus.

8 Claims, 7 Drawing Sheets

US 7,993,458 B2

VACUUM PROCESSING APPARATUS AND METHOD

This application is a Continuation Application of PCT International Application No. PCT/JP 2007/050271 filed on Jan. 11, 2007, which designated the United States.

FIELD OF THE INVENTION

The present invention relates to a vacuum processing apparatus and method for performing a desired process on a target object in a vacuum state; and, more particularly, to a technology for controlling an atmosphere in a vacuum transfer chamber where a target object is transferred to and from a vacuum processing chamber under a reduced pressure.

BACKGROUND OF THE INVENTION

In manufacturing a semiconductor device or a flat panel display (FPD), various processes such as a film forming process, a heat treatment process, a dry etching process, a cleaning process and the like are performed in a vacuum vessel by using required processing gases. For example, apparatuses for performing such vacuum processes are disclosed in Japanese Patent Laid-open Publication Nos. 2000-127069 and H3-087386). In order to load and unload a target substrate, e.g., a semiconductor wafer or a glass substrate, without opening the vacuum vessel or vacuum processing chamber to the atmosphere, the apparatuses include a vacuum transfer chamber capable of maintaining a reduced pressure therein all the time or capable of being switched selectively between an atmospheric state and a depressurized state. The vacuum transfer chamber is connected to the vacuum processing chamber via a gate valve and a transfer robot is provided in the vacuum transfer chamber.

However, the vacuum processing apparatus has a problem of organic contamination that organic substances generated from a moving part or a frictional part in the vacuum transfer chamber are attached to the target object. Generally, the amount of organic contamination (absorption) of the target object in a vacuum state is much larger than that in the atmosphere. In particular, if the vacuum processing apparatus has a cluster tool type structure, an overall processing time, i.e. a stay time of the target object, takes long due to many processes in the system. Further, since processing under a high vacuum, e.g., $10^{-4}$ Pa, tends to increase along with the trend of high precision of processes, there is a case where the vacuum transfer chamber is maintained at a vacuum pressure, e.g., 10 mTorr (about 1.33 Pa) or less. As the vacuum transfer chamber is evacuated to a high vacuum level, organic substances are easily attached to the target object.

Such organic attachment or contamination deteriorates the reliability of processes such as film forming and etching processes in the vacuum processing chamber, resulting in a poor production yield. For example, in case of forming a gate oxide film, an oxide film withstand voltage is degraded, and native oxide film growth is accelerated to increase a contact resistance in forming a contact. Furthermore, incubation time increases in the film forming process, which leads to increase of variation in thickness.

Particularly, if organic substances which are produced or scattered from grease applied to a vacuum sealing O-ring or bearing, which are generated from a transfer mechanism, e.g., a transfer belt, or which are detached from surfaces of components in the processing chamber after being attached thereto due to poor cleaning, are attached to the surface of the target object, it is hard to remove the organic substances and a defective area on a target surface becomes larger. Therefore, the production yield is significantly reduced as described above.

SUMMARY OF THE INVENTION

It is, therefore, an object of the present invention to provide a vacuum processing apparatus and method capable of preventing organic contamination of a target object in a vacuum transfer chamber.

In accordance with a first aspect of the present invention, there is provided a vacuum processing apparatus including: a vacuum transfer chamber having a transfer unit for transferring a target object to and from an adjacent chamber, the inside of the vacuum transfer chamber being maintained at a depressurized state; a vacuum processing chamber, which is disposed adjacent to the vacuum transfer chamber, for performing a predetermined process on the target object under a reduced pressure; a gas exhaust unit for evacuating the vacuum transfer chamber; a purge gas supply unit for supplying a purge gas into the vacuum transfer chamber; and a control unit for controlling a flow rate of the purge gas supplied into the vacuum transfer chamber from the purge gas supply unit while monitoring whether or not an internal pressure of the vacuum transfer chamber is within a predetermined pressure range.

In accordance with the apparatus of the first aspect, even if organic substances are scattered from organic materials in the vacuum transfer chamber due to degasification, they are diluted by the purge gas supplied from the purge gas supply unit and the amount of the organic substances attached to the target object can be reduced. In particular, under a high vacuum, much more organic substances are likely to be attached to the target object while the amount of the organic substances attached thereto can be significantly reduced by controlling the flow rate of the purge gas. Preferably, an upper limit of the pressure range is set to 66.7 Pa (500 mTorr) or less, and the flow rate of the purge gas is controlled to 10 sccm or more.

In the apparatus of the first aspect, for example, a load-lock chamber is disposed adjacent to the vacuum transfer chamber. The inside of the load-lock chamber is selectively changed into an atmospheric state or a depressurized state and the load-lock chamber temporarily stores the target object which is transferred between an atmospheric space and the vacuum transfer chamber. Alternatively, the vacuum transfer chamber is configured as a load-lock chamber. In this case, the load-lock chamber includes the transfer unit therein and its inside is selectively changed into an atmospheric state or a depressurized state.

In accordance with a second aspect of the present invention, there is provided a vacuum processing apparatus including: a vacuum transfer chamber having a transfer unit for transferring a target object to and from an adjacent chamber, the inside of the vacuum transfer chamber being maintained at a depressurized state; a vacuum processing chamber, which is disposed adjacent to the vacuum transfer chamber, for performing a predetermined process on the target object under a reduced pressure; a load-lock chamber for temporarily storing the target object which is transferred between an atmospheric space and the vacuum transfer chamber, the load-lock chamber being disposed adjacent to the vacuum transfer chamber and its inside being selectively changed into an atmospheric state or a depressurized state; a gas exhaust unit for evacuating the load-lock chamber; a purge gas supply unit for supplying a purge gas into the load-lock chamber; and a control unit for controlling a flow rate of the purge gas supplied into the load-lock chamber from the purge gas supply unit while monitoring whether or not an internal pressure of the load-lock chamber is within a predetermined pressure range.

In accordance with the apparatus of the second aspect, even if organic substances are scattered from organic materials in the load-lock chamber due to degasification, they are diluted by the purge gas supplied from the purge gas supply unit and the amount of the organic substances attached to the target object can be reduced. In particular, under a high vacuum, much more organic substances are likely to be attached to the target object while the amount of the organic substances attached thereto can be significantly reduced by controlling the flow rate of the purge gas. Preferably, an upper limit of the pressure range is set to 66.7 Pa (500 mTorr) or less, and the flow rate of the purge gas is controlled to 10 sccm or more. Further, it is preferable to set the internal pressure of the load-lock chamber higher than that of the vacuum transfer chamber in order to prevent the atmosphere in the vacuum transfer chamber close to the vacuum processing chamber from diffusing into the load-lock chamber.

In accordance with a third aspect of the present invention, there is provided a vacuum processing apparatus including: a vacuum transfer chamber having a transfer unit for transferring a target object to and from an adjacent chamber, the inside of the vacuum transfer chamber being maintained at a depressurized state; a vacuum processing chamber, which is disposed adjacent to the vacuum transfer chamber, for performing a predetermined process on the target object under a reduced pressure; a gas exhaust unit for evacuating the vacuum transfer chamber; a purge gas supply unit for supplying a purge gas into the vacuum transfer chamber; and a control unit for controlling an internal pressure of the vacuum transfer chamber while monitoring whether or not a flow rate of the purge gas supplied into the vacuum transfer chamber from the purge gas supply unit is smaller than a lower limit of the flow rate.

In accordance with the apparatus of the third aspect, even if organic substances are scattered from organic materials in the vacuum transfer chamber due to degasification, they are diluted by the purge gas supplied from the purge gas supply unit and the amount of the organic substances attached to the target object can be reduced. In particular, under a high vacuum, much more organic substances are likely to be attached to the target object while the amount of the organic substances attached thereto can be significantly reduced by controlling the flow rate of the purge gas. Preferably, a lower limit of the flow rate is set to 10 sccm or more and the internal pressure of the vacuum transfer chamber is controlled to 66.7 Pa (500 mTorr) or less.

In the apparatus of the third aspect, for example, a load-lock chamber is disposed adjacent to the vacuum transfer chamber. The inside of the load-lock chamber is selectively changed into an atmospheric state or a depressurized state and the load-lock chamber temporarily stores the target object which is transferred between an atmospheric space and the vacuum transfer chamber. Alternatively, the vacuum transfer chamber is configured as a load-lock chamber. In this case, the load-lock chamber includes the transfer unit therein and its inside is selectively changed into an atmospheric state or a depressurized state.

In accordance with a fourth aspect of the present invention, there is provided a vacuum processing apparatus including: a vacuum transfer chamber having a transfer unit for transferring a target object to and from an adjacent chamber, the inside of the vacuum transfer chamber being maintained at a depressurized state; a vacuum processing chamber, which is disposed adjacent to the vacuum transfer chamber, for performing a predetermined process on the target object under a reduced pressure; a load-lock chamber for temporarily storing the target object which is transferred between an atmospheric space and the vacuum transfer chamber, the load-lock chamber being disposed adjacent to the vacuum transfer chamber and its inside being selectively changed into an atmospheric state or a depressurized state; a gas exhaust unit for evacuating the load-lock chamber; a purge gas supply unit for supplying a purge gas into the load-lock chamber; and a control unit for controlling an internal pressure of the vacuum transfer chamber while monitoring whether or not a flow rate of the purge gas supplied into the vacuum transfer chamber from the purge gas supply unit is smaller than a lower limit of the flow rate.

In accordance with the apparatus of the fourth aspect, even if organic substances are scattered from organic materials in the load-lock chamber due to degasification, they are diluted by the purge gas supplied from the purge gas supply unit and the amount of the organic substances attached to the target object can be reduced. In particular, under a high vacuum, much more organic substances are likely to be attached to the target object while the amount of the organic substances attached thereto can be significantly reduced by controlling the flow rate of the purge gas. Preferably, an upper limit of the pressure range is set to 66.7 Pa (500 mTorr) or less, and the flow rate of the purge gas is controlled to 10 sccm or more. Further, it is preferable to set the internal pressure of the load-lock chamber higher than that of the vacuum transfer chamber in order to prevent the atmosphere in the vacuum transfer chamber close to the vacuum processing chamber from diffusing into the load-lock chamber.

A vacuum processing method of the present invention transfers a target object between a vacuum processing chamber and a vacuum transfer chamber under a reduced pressure and performs a predetermined process on the target object in the vacuum transfer chamber. A purge gas is supplied into the vacuum transfer chamber while the vacuum transfer chamber is evacuated, and an internal pressure of the vacuum transfer chamber is controlled to 66.7 Pa (500 mTorr) or less, and a flow rate of the purge gas is controlled to 10 sccm or more.

DETAILED DESCRIPTION OF THE PREFERRED EMBODIMENTS

Hereinafter, embodiments of the present invention will be described in detail with reference to the accompanying drawings.

Figure 1:
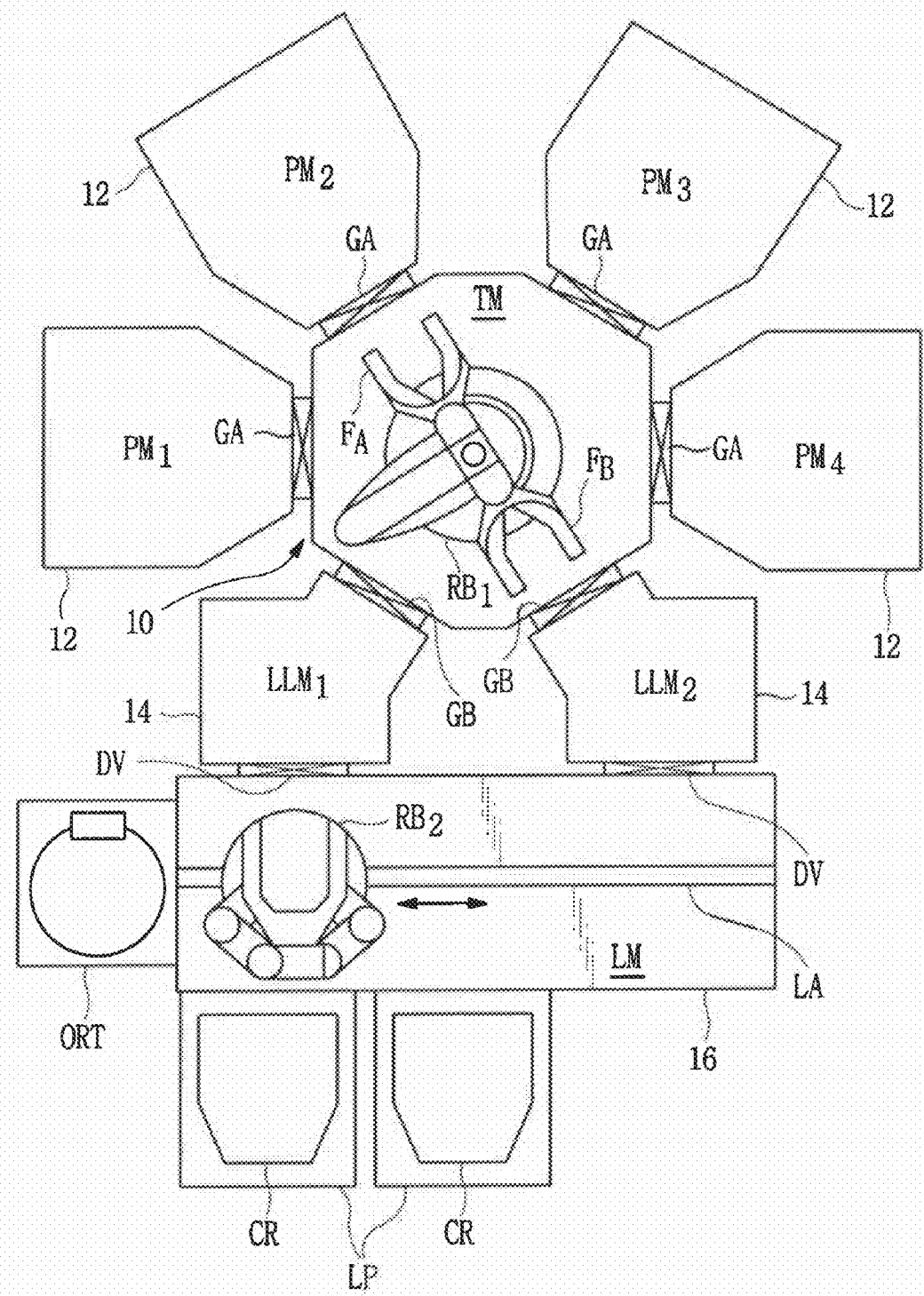
FIG. 1 shows a schematic plan view of a vacuum processing apparatus (cluster tool) in accordance with an embodiment of the present invention.

FIG. 1 shows an overall configuration of a vacuum processing apparatus in accordance with a first preferred embodiment of the present invention. The vacuum processing apparatus, a so-called cluster tool, is installed in a clean room, and includes, e.g., process modules $PM_1$, $PM_2$, $PM_3$ and $PM_4$ and two load-lock modules $LLM_1$ and $LLM_2$ disposed around a hexagonal transfer module TM having a transfer chamber 10 in a cluster shape.

Each of the process modules $PM_1$, $PM_2$, $PM_3$ and $PM_4$ has a vacuum processing chamber 12 whose internal pressure is independently set and controlled. The load-lock modules $LLM_1$ and $LLM_2$ each include a load-lock chamber 14 whose inside is capable of being switched selectively into an atmospheric state or a depressurized state, as will be described below. The vacuum processing chambers 12 of the process modules $PM_1$, $PM_2$, $PM_3$ and $PM_4$ are connected to the vacuum transfer chamber 10 of the transfer module TM through respective gate valves GA. The load-lock chambers 14 of the load-lock modules $LLM_1$ and $LLM_2$ are connected to the vacuum transfer chamber 10 through respective gate valves GB. The vacuum transfer chamber 10 includes a vacuum transfer robot $RB_1$ with a pair of transfer arms $F_A$ and $F_B$ which are revolvable, extendible and contractible.

In each vacuum processing chamber 12 of the process modules $PM_1$, $PM_2$, $PM_3$ and $PM_4$, required single-wafer processes, e.g., a film forming process such as CVD (Chemical Vapor Deposition), ALD (Atomic Layer Deposition) or PVD (Physical Vapor Deposition), a heat treatment process, a cleaning process of a semiconductor wafer surface, a dry etching process and the like, are performed by using specific resources such as processing gases, a high frequency power, heat and the like.

The load-lock modules $LLM_1$ and $LLM_2$ are configured such that the inside of each load-lock chamber 14 can be switched between an atmospheric state and a depressurized state of a predetermined vacuum level. The load-lock chambers 14 are connected to an atmospheric transfer chamber 16 of a loader module LM via respective door valves DV, the loader module LM being provided on the opposite side of the transfer module TM and being under an atmospheric pressure.

Load ports LP and an orientation flat alignment mechanism ORT are provided adjacent to the loader module LM. The load ports LP are used to load and unload a wafer cassette CR to and from an external transfer vehicle, the wafer cassette CR accommodating, e.g., a batch of 25 semiconductor wafers (hereinafter, simply referred to as "wafers") W. The orientation flat alignment mechanism ORT is used for the alignment of an orientation flat or notch of a wafer W in a certain position or direction.

An atmospheric transfer robot $RB_2$ installed in the loader module LM has a pair of extendible/contractible transfer arms, can be moved along a linear guide (linear slide) LA in a horizontal direction, and is vertically movable and revolvable. Further, the atmospheric transfer robot $RB_2$ travels between the load ports LP, the orientation flat alignment mechanism ORT and the load-lock modules $LLM_1$ and $LLM_2$ to transfer wafers W sheet-by-sheet. Here, the atmospheric transfer robot $RB_2$ loads the semiconductor wafer W into the loader module LM while an LP door (not shown) provided at the front end of the wafer cassette CR is open. The linear guide LA including, e.g., a permanent magnet, a magnetic driving coil, a scale head and the like, controls linear motion of the atmospheric transfer robot $RB_2$ in accordance with a command from a controller.

Hereinafter, there will be explained a basic wafer transfer operation for performing a series of processes on a single wafer W in the cluster tool, the wafer W being in the wafer cassette CR loaded in the load port LP.

The transfer robot $RB_2$ of the loader module LM takes a single wafer W out of the wafer cassette CR on the load port LP and carries it to the orientation flat alignment mechanism ORT, where the wafer W is then subjected to orientation flat alignment. After that, the transfer robot $RB_2$ moves the wafer W to either of the load-lock modules $LLM_1$ and $LLM_2$, e.g., $LLM_1$. The load-lock module $LLM_1$ receives the wafer W under an atmospheric pressure. Thereafter, the load-lock chamber 14 of the load-lock module $LLM_1$ is evacuated to a certain vacuum level, and the wafer W is transferred to the vacuum transfer robot $RB_1$ of the transfer module TM under the reduced pressure.

The transfer robot $RB_1$ loads the wafer W taken out of the load-lock module $LLM_1$ into a first process module, e.g., $PM_1$, by using either of the transfer arms $F_A$ and $F_B$. The process module $PM_1$ performs a first single-wafer processing under specific processing conditions (gas, pressure, power, time and the like) according to a predetermined recipe.

When the first single-wafer process is completed, the transfer robot $RB_1$ takes out the wafer W from the first process module $PM_1$. Subsequently, the transfer robot $RB_1$ loads the wafer W taken out of the first process module $PM_1$ into a second process module, e.g., $PM_2$. In the second process module $PM_2$, a second single-wafer process is carried out under specific processing conditions according to a predetermined recipe.

If the second single-wafer process is completed, the transfer robot $RB_1$ takes out the wafer W from the second process module $PM_2$. After that, if there remains another process, the transfer robot $RB_1$ loads the wafer W taken out of the second process module $PM_2$ to a third process module, e.g., $PM_3$ or $PM_4$. Otherwise, the transfer robot $RB_1$ transfers the wafer W to either of the load-lock modules $LLM_1$ and $LLM_2$. After the completion of the process in the third process module, if there remains still another process, the wafer W is loaded into the next process module, and otherwise, it is sent back to either of the load-lock modules $LLM_1$ and $LLM_2$.

If the wafer W, which has undergone a series of processes in the plurality of process modules $PM_1$, $PM_2$, $PM_3$ and $PM_4$ of the cluster tool, is loaded into one of the load-lock modules, e.g., $LLM_2$, the load-lock chamber 14 of the load-lock module $LLM_2$ is converted into an atmospheric state from a depressurized state. Thereafter, the transfer robot $RB_2$ of the loader module LM unloads the wafer W from the load-lock module $LLM_2$ which is open to the atmosphere, and returns it to the wafer cassette CR. Further, a heating or cooling process may be performed on the wafer W under a desired atmosphere while the wafer W stays in the load-lock module $LLM_1$ or $LLM_2$.

As described above, with this cluster tool, it is possible to successively perform a series of processes on the wafer by sequentially transferring it to the plurality of process modules under a vacuum. Particularly, in case of a vacuum thin film forming process, the plurality of process modules can be programmed to successively perform different film forming processes so that desired thin films can be laminated one over another. Further, since the plurality of process modules continuously repeat their single-wafer processes in a pipelined manner, a high operating rate and productivity can be obtained.

Figure 2:
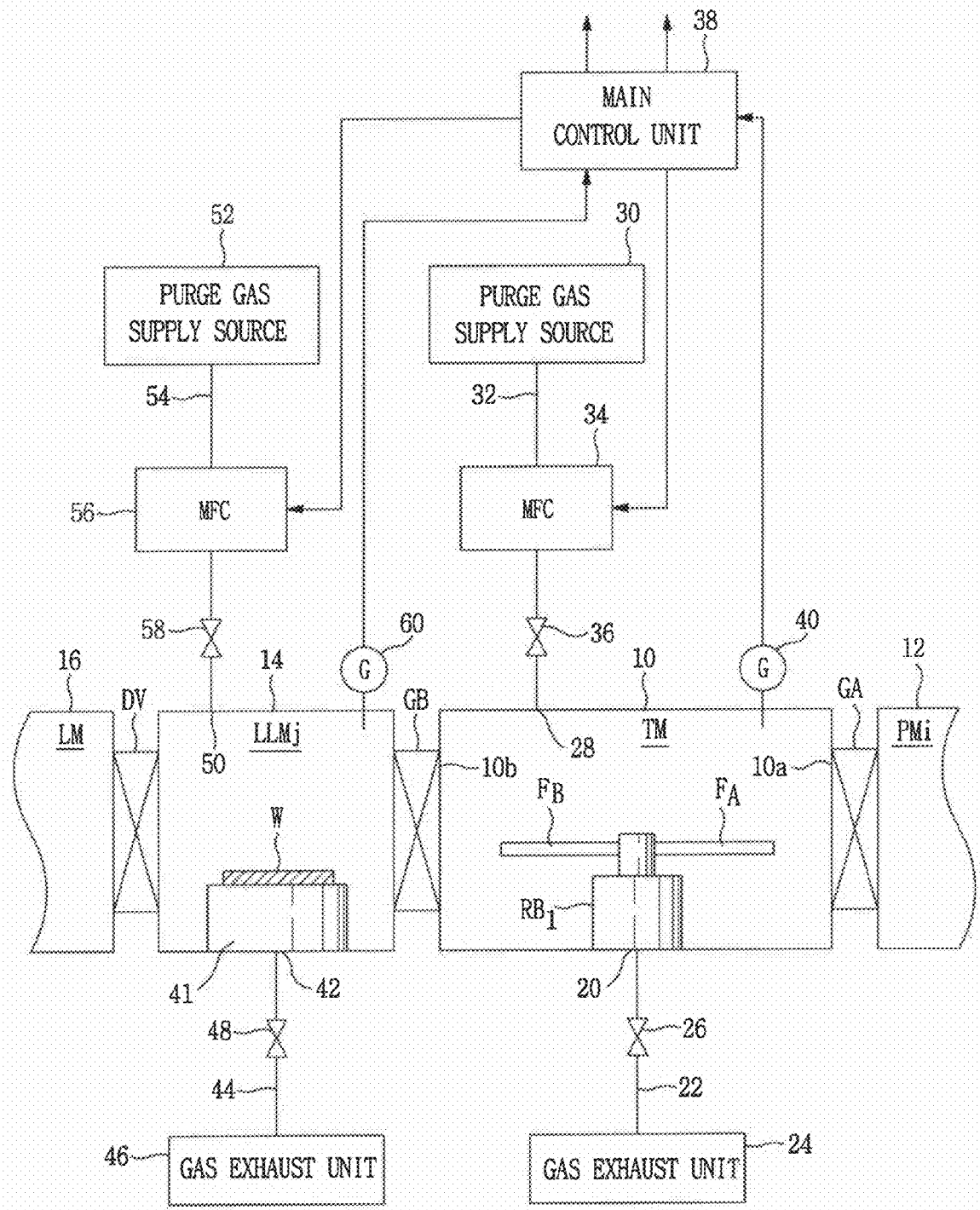
FIG. 2 is a block diagram showing a mechanism to individually control atmospheres in a vacuum transfer chamber and in a load-lock chamber.

FIG. 2 shows a mechanism to individually control the atmospheres in the vacuum transfer chamber 10 of the transfer module LM and in the load-lock chamber 14 of each load-lock module $LLM_j$ (j=1 or 2).

Provided at each side of the vacuum transfer chamber 10 of the transfer module TM are a first wafer loading/unloading port 10a, which is connected to a wafer loading/unloading port of each process module $PM_i$ (i=1, 2, 3 or 4) via a gate valve GA, and a second wafer loading/unloading port 10b, which is connected to the load-lock chamber 14 of each load-lock module $LLM_j$ via a gate valve GB.

Provided at a bottom surface of the vacuum transfer chamber 10 is a gas exhaust port 20, which is connected to a gas exhaust unit 24 through a gas exhaust line 22. An opening/closing valve 26 provided on the gas exhaust line 22 is kept open in a normal state. The gas exhaust unit 24 includes, e.g., a vacuum pump such as a turbo-molecular pump or a flow rate control valve such as a throttle valve, and evacuates the vacuum transfer chamber 10 to a vacuum level at a constant gas exhaust rate.

A gas supply port 28 is provided at an upper portion, e.g., a ceiling surface, of the vacuum transfer chamber 10. The gas supply port 28 is connected to a gas supply line 32 of a purge gas supply source 30, and a mass flow controller (MFC) 34 and an opening/closing valve 36 are provided on the gas supply line 32. In a normal state, the opening/closing valve 36 is kept open, and an inert gas, preferably $N_2$ gas, serving as a purge gas or a pressure control gas is supplied into the vacuum transfer chamber 10 from the purge gas supply source 30 via the MFC 34 and the opening/closing valve 36. Here, the MFC 34 is provided with a gas mass sensor and a flow rate control valve, and it feedback-controls the flow rate of the $N_2$ gas flowing through the gas supply line 32 to thereby maintain the flow rate of the $N_2$ gas at a flow rate set value. A main control unit 38 sends the flow rate set value to the MFC 34.

A vacuum gauge 40 for detecting an internal pressure of the vacuum transfer chamber 10 is installed at a ceiling portion thereof, and an output signal (pressure measurement value) of the vacuum gauge 40 is sent to the main control unit 38 as a pressure monitor signal. As described above, since the gas exhaust rate of the gas exhaust unit 24 is maintained constant, the internal pressure of the vacuum transfer chamber 10 is determined by the flow rate of the purge gas supplied from the purge gas supply mechanism 30, 32 and 34. Therefore, the main control unit 38 can control the internal pressure of the vacuum transfer chamber 10 to be within a predetermined range through the application of the flow rate set value to the MFC 36. However, if the exhaust flow rate of the gas exhaust unit 24 decreases or the airtightness of the vacuum transfer chamber 10 becomes poor, the internal pressure of the vacuum transfer chamber 10 may be abnormally increased even when the flow rate of the purge gas is controlled as desired. In this case, since the main control unit 38 monitors the internal pressure of the vacuum transfer chamber 10 through the vacuum gauge 40, if the pressure exceeds a predetermined upper limit, the main control unit 38 determines occurrence of an abnormality and then takes such actions as changing the flow rate set value for the MFC 34, giving an alarm and stopping the operation of the apparatus.

In this embodiment, the internal pressure of the vacuum transfer chamber 10 is determined appropriately higher than that of the vacuum processing chamber 12 of each process module $PM_i$. As for the common cluster tool, the internal pressure of the vacuum transfer chamber 10 is set 500 mTorr (66.7 Pa) or less, for example, 200 mTorr (26.7 Pa). Further, the flow rate of the purge gas supplied into the vacuum transfer chamber 10 is set or controlled to an optimal value for preventing organic substances from attaching to the wafer W loaded in the vacuum transfer chamber 10.

Figure 3:
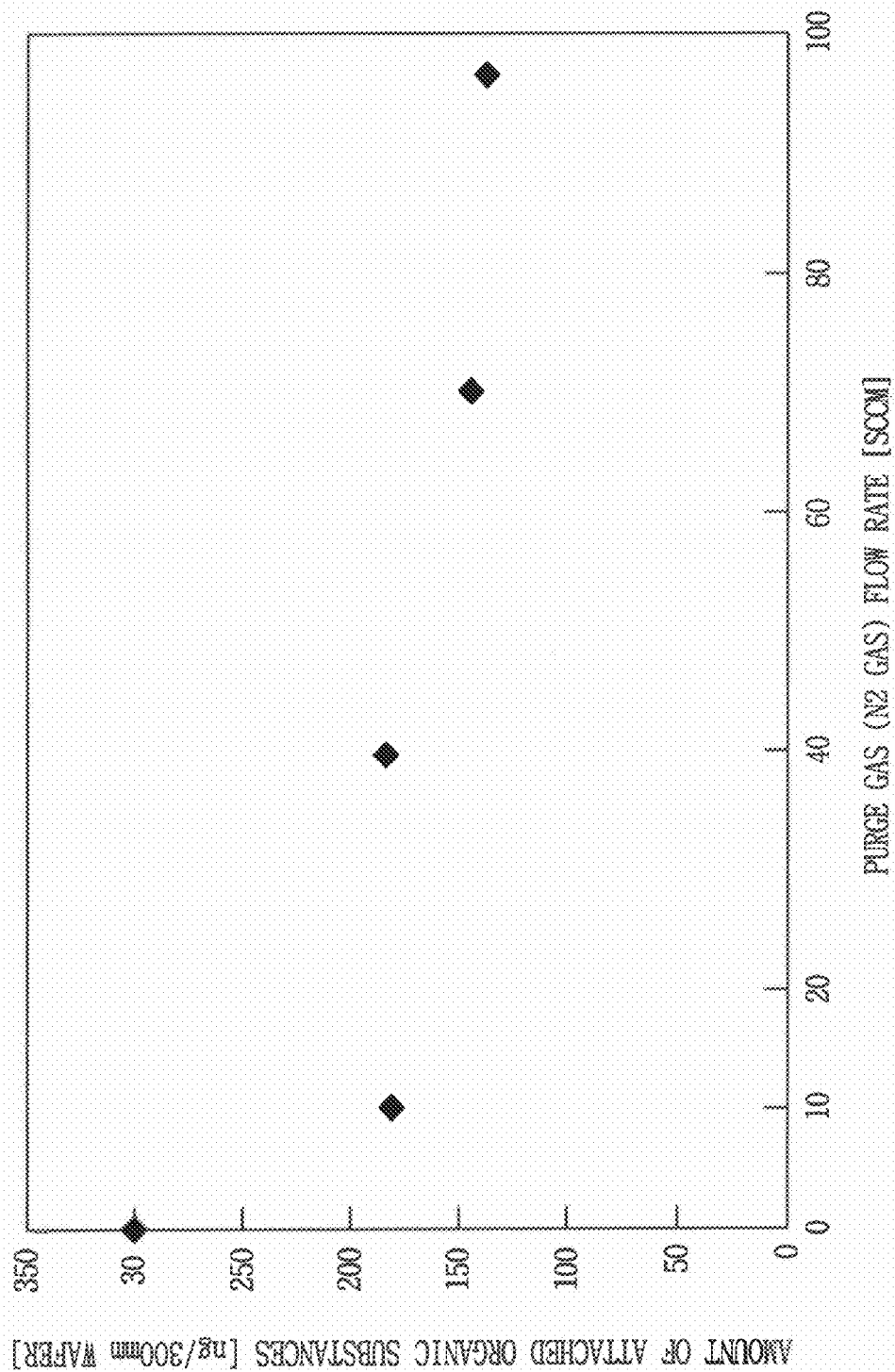
FIG. 3 shows the dependency of the amount of organic substances attached to a wafer on the flow rate of the purge gas.

FIG. 3 shows the results obtained by measuring the dependency of the amount of organic substances attached to the wafer on the flow rate of the purge gas. The measurement was performed under the condition that the temperature of the inner wall of the vacuum chamber is 23° C., the internal pressure thereof is set 53 Pa, the purge gas is $N_2$ gas, and the wafer has a diameter of 300 mm.

In the results shown in FIG. 3, the amounts of organic substances attached to the wafer were about 300 ng, about 180, about 180, about 140 ng and about 135 ng when the flow rates of the purge gas ($N_2$ gas) were 0 sccm, 10 sccm, 40 sccm, 75 sccm and 96 sccm, respectively. From the above results, it can be noted that the attachment amount of organic substances can be effectively reduced when the flow rate of the purge gas ($N_2$ gas) is 10 sccm or more.

This can be theoretically explained as follows. Organic materials such as a vacuum sealing O-ring and grease, and organic solvents such as acetone are sources of organic contaminants in the vacuum transfer chamber. The rate of gaseous organic materials released from the above organic materials and from the inner wall surface of the chamber depends on the temperature and the evaporation enthalpy of each organic component based on the Clausius-Clapeyron equation. Therefore, if the temperature is constant, the release rate of organic materials becomes constant. Meanwhile, the amount of organic materials attached to the wafer in the vacuum transfer chamber depends on the concentration of the organic materials in the vacuum transfer chamber. Accordingly, in order to prevent the organic materials from attaching to the wafer in the vacuum transfer chamber, it is effective to reduce the concentration of organic materials by supplying the purge gas into the vacuum transfer chamber.

Further, the flow rate of the purge gas ($N_2$ gas) has an upper limit due to various factors such as its influence on processes and pumping capacity of the gas exhaust mechanism. The upper limit is generally determined as 1000 sccm.

Referring back to FIG. 2, the load-lock chamber 14 of the load-lock module $LLM_j$ includes a mounting table 41 for mounting thereon the wafer W. Installed in the mounting table 41 is a lift pin mechanism (not shown) for moving up and down the wafer W to transfer the wafer W to and from the transfer robots $RB_1$ and $RB_2$. Furthermore, a heater (not shown) or a cooling unit (not shown) may be installed in the mounting table 41 to heat or cool the wafer W in the load-lock chamber 14.

Formed at a bottom surface of the load-lock chamber 14 is a gas exhaust port 42, which is connected to a gas exhaust unit 46 through a gas exhaust line 44. An opening/closing valve 48 is provided on the gas exhaust line 44. The opening/closing valve 48 is opened when the inside of the load-lock chamber 14 is changed into a depressurized state or while the internal pressure thereof is maintained at a reduced level. On the contrary, it is closed when the inside of the load-lock chamber 14 is changed into an atmospheric state or while the internal pressure thereof is maintained at an atmospheric pressure. The gas exhaust unit 46 includes, for example, a dry pump for rough pumping or a high vacuum turbo-molecular pump, and a flow rate control valve, e.g., a throttle valve. Further, the load-lock chamber 14 is evacuated by the gas exhaust unit 46 at a constant high gas exhaust rate when the inside of the load-lock chamber 14 is changed from the atmospheric state to the depressurized state, whereas the load-lock chamber 14 is evacuated at a constant low gas exhaust rate while the inside of the load-lock chamber 14 is maintained at the depressurized state.

A gas supply port 50 is formed at an upper portion, e.g., a ceiling surface, of the load-lock chamber 14. The gas supply port 50 is connected to a gas supply line 54 of a purge gas supply source 52, and a mass flow controller (MFC) 56 and an opening/closing valve 58 are provided on the gas supply line 54. The opening/closing valve 58 is kept open when or while the purge gas is supplied into the load-lock chamber 14 (when the load-lock chamber 14 is changed into an atmospheric state from a depressurized state and while the load-lock chamber 14 is maintained at a predetermined vacuum level). Otherwise, the opening/closing valve 58 is kept closed.

While the opening/closing valve 58 is opened, and an inert gas, preferably $N_2$ gas, serving as the purge gas or the pressure control gas is supplied into the load-lock chamber 14 from the purge gas supply source 52 via the MFC 56 and the opening/closing valve 58. Here, the MFC 56 is provided with a gas mass sensor and a flow rate control valve. The flow rate control valve is fully opened when the inside of the load-lock chamber 14 is changed into an atmospheric state from a depressurized state. Further, the MFC 56 feedback-controls the flow rate of the $N_2$ gas flowing through the gas supply line 58 to thereby maintain a flow rate set value while the internal pressure of the load-lock chamber 14 is maintained at a predetermined vacuum level. The main control unit 38 applies the flow rate set value to the MFC 56. Installed at a ceiling portion of the load-lock chamber 14 is a vacuum gauge 60 for detecting its internal pressure, and an output signal (pressure measurement value) of the vacuum gauge 60 is sent to the main control unit 38 as a pressure monitor signal.

The atmosphere in the load-lock chamber 14 is controlled in the same manner as that of the aforementioned vacuum transfer chamber 10 of the transfer module TM, while the load-lock chamber 14 is maintained at the depressurized state. To be specific, since the gas exhaust rate of the gas exhaust unit 46 is maintained constant as described above, the internal pressure of the load-lock chamber 14 is determined by the flow rate of the purge gas ($N_2$ gas) supplied from the purge gas supply mechanism 52, 54 and 56. Therefore, the main control unit 38 can control the internal pressure of the load-lock chamber 14 to be within a predetermined range through the application of the flow rate set value to the MFC 56. However, if the exhaust flow rate of the gas exhaust unit 46 decreases or the airtightness of the load-lock chamber 14 becomes poor, the internal pressure of the load-lock chamber 14 may be abnormally increased even when the flow rate of the purge gas ($N_2$ gas) is controlled as desired. In this case, since the main control unit 38 monitors the internal pressure of the load-lock chamber 14 through the vacuum gauge 60, if the pressure exceeds a predetermined upper limit, the main control unit 38 determines occurrence of an abnormality and then takes such actions as changing the flow rate set value for the MFC 56, giving an alarm and stopping the operation of the apparatus.

In FIG. 2, the main control unit 38 is configured to directly or indirectly control the operations of the opening/closing valves 26, 36, 48, 58, the transfer robot $RB_1$, the gate valves GA, GB, and the door valve DV as well as the MFCs 34, 56.

In this embodiment, the internal pressure of the load-lock chamber 14 is determined appropriately higher than that of the vacuum transfer chamber 10 of the transfer module TM. In the common cluster tool, the internal pressure of the load-lock chamber 14 is set 500 mTorr (66.7 Pa) or less, for example, 200 mTorr to 400 mTorr (26.7 Pa to 53.4 Pa). Meanwhile, the flow rate of the purge gas supplied into the load-lock chamber 14 is set and controlled to an optimal value for preventing organic substances from attaching to the wafer W loaded in the load-lock chamber 14. Furthermore, according to the measurement results shown in FIG. 3 and the above description, it can also be noted that the amount of organic substances attached to the wafer W in the load-lock chamber 14 can be effectively reduced by controlling the flow rate of the purge gas supplied into the load-lock chamber 14 to 10 sccm or more.

Figure 4:
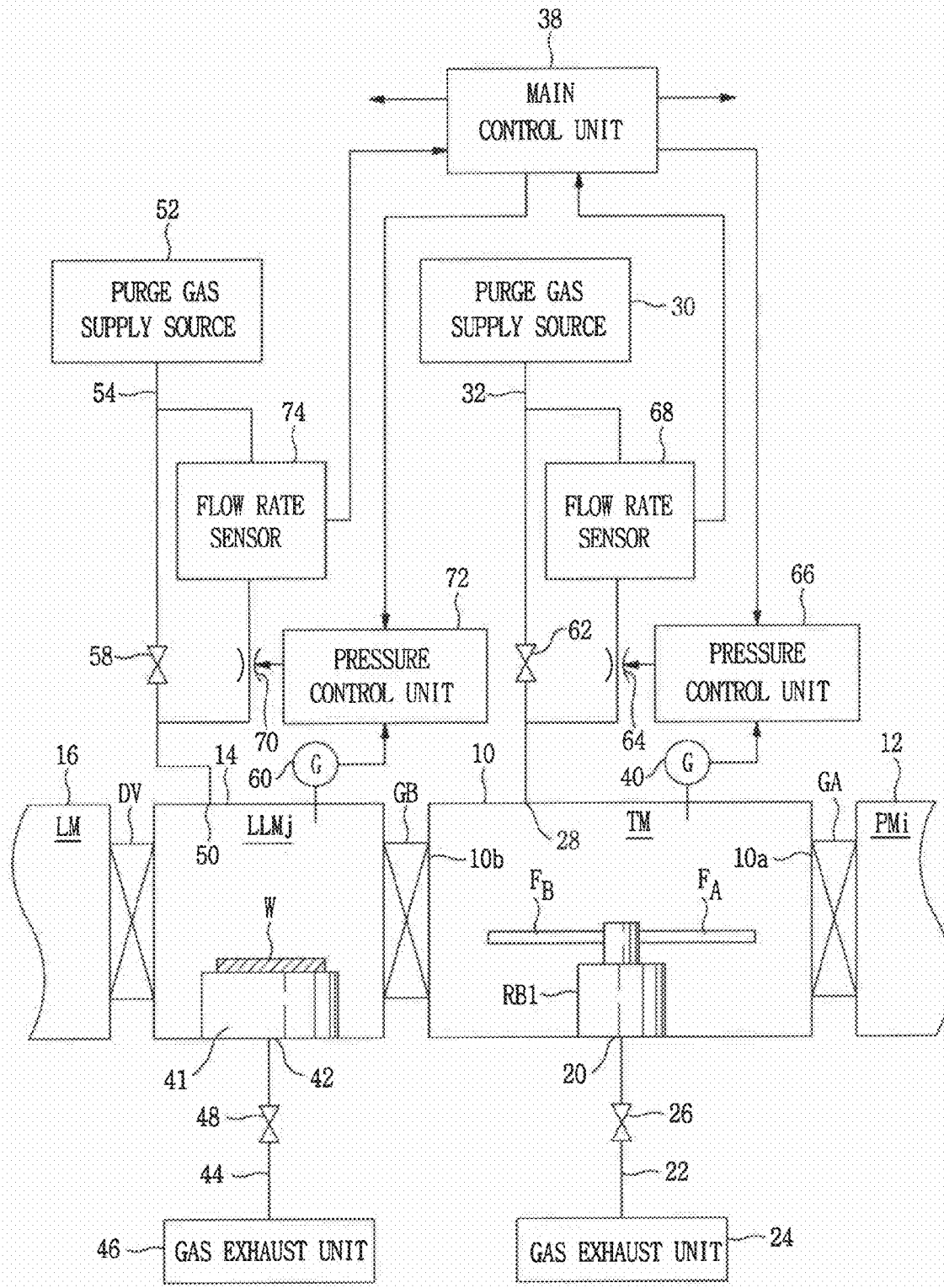
FIG. 4 illustrates a block diagram showing another mechanism to individually control atmospheres in the vacuum transfer chamber and in the load-lock chamber.

FIG. 4 shows another mechanism to individually control the atmospheres in the vacuum transfer chamber 10 and in the load-lock chamber 14. In the drawing, parts having substantially same configurations and functions as those of the aforementioned preferred embodiment (FIG. 2) are designated by same reference numerals.

In accordance with this embodiment, the gas supply port 28 formed at an upper portion of the vacuum transfer chamber 10 is connected to the gas supply line 32 of the purge gas supply source 30, and an opening/closing valve 62 and a flow rate control valve 64 are provided on the gas supply line 32 in parallel with each other. The flow rate control valve 64 is, e.g., a proportional control valve, whose opening ratio is controlled by a pressure control unit 66. An output signal (pressure measurement value) from the vacuum gauge 40 for detecting an internal pressure of the vacuum transfer chamber 10 is sent to the pressure control unit 66 as a feedback signal. Further, a flow rate sensor 68 is installed on the gas supply line 32 in series with the flow rate control valve 64, and an output signal (flow rate measurement value) from the flow rate sensor 68 is sent to the main control unit 38 as a flow rate monitor signal.

The opening/closing valve 62 is opened when the inside of the vacuum transfer chamber 10 is set at an atmospheric state for the maintenance. In a normal state, the purge gas serving as a pressure control gas is supplied from the purge gas supply source 30 into the vacuum transfer chamber 14 via the flow rate control valve 64 with the opening/closing valve 62 closed, and the opening ratio of the flow rate control valve 64, i.e., the flow rate of the supplied gas is feedback-controlled by the vacuum gauge 40 and the pressure control unit 66. Here, the internal pressure of the vacuum transfer chamber 10 is set to a pressure set value, e.g., 200 mTorr (26.7 Pa). Further, the main control unit 38 sends the desired pressure set value to the pressure control unit 66, and monitors the flow rate of the purge gas ($N_2$ gas) supplied into the vacuum transfer chamber 10 using the output signal (flow rate measurement value) of the flow rate sensor 68.

Here, since the gas exhaust rate of the gas exhaust unit 24 is maintained constant as mentioned above, the flow rate of the purge gas supplied into the vacuum transfer chamber 10 corresponds to the internal pressure of the vacuum transfer chamber 10 with a specific relationship. Therefore, the main control unit 38 can control the flow rate of the purge gas to be greater than a predetermined value or within a predetermined range through the pressure set value for the pressure control unit 66. However, if the exhaust flow rate of the gas exhaust unit 24 decreases, the flow rate of the purge gas may be abnormally decreased even when the internal pressure of the vacuum transfer chamber 10 is controlled as desired. In this case, since the main control unit 38 monitors the flow rate of the purge gas supplied into the vacuum transfer chamber 10 from the purge gas supply source 30 through the flow rate sensor 68, if the flow rate of the purge gas becomes lower than the predetermined lower limit, e.g., 10 sccm, the main control unit 38 determines occurrence of an abnormality and then takes such actions as changing the pressure set value for the pressure control unit 66, giving an alarm and stopping the operation of the apparatus.

In the load-lock chamber 14, the gas supply port 50 is connected to the gas supply line 54 of the purge gas supply source 52, and the opening/closing valve 58 and a flow rate control valve 70 are provided on the gas supply line 54 in parallel with each other. The flow rate control valve 70 is, e.g., a proportional control valve, whose opening ratio is controlled by a pressure control unit 72. An output signal (pressure measurement value) from the vacuum gauge 60 for detecting an internal pressure of the load-lock chamber 14 is sent to the pressure control unit 72 as a feedback signal. Further, a flow rate sensor 74 is installed on the gas supply line 54 in series with the flow rate control valve 70, and an output signal (flow rate measurement value) from the flow rate sensor 74 is sent to a main control unit 38 as a flow rate monitor signal.

When the inside of the load-lock chamber 14 is changed into an atmospheric state from a depressurized state, the opening/closing valve 58 is opened so that the purge gas can be supplied into the load-lock chamber 14 from the purge gas supply source 52 via the opening/closing valve 58 opened. Further, while the internal pressure of the load-lock chamber 14 is maintained at a predetermined vacuum level after it is changed into a depressurized state from an atmospheric state, the purge gas serving as a pressure control gas is supplied into the load-lock chamber 14 from the purge gas supply source 52 via the flow rate control valve 70 with the opening/closing valve 58 closed. Further, the opening ratio of the flow rate control valve 70, i.e., the flow rate of the supplied gas is feedback-controlled by the vacuum gauge 60 and the pressure control unit 72, and the internal pressure of the load-lock chamber 14 is set to the pressure set value, e.g., 400 mTorr (53.4 Pa).

The main control unit 38 sends the desired pressure set value to the pressure control unit 72 and monitors the flow rate of the purge gas supplied into the load-lock chamber 14 by using the output signal (flow rate measurement value) of the flow rate sensor 74. In case of the load-lock chamber 14, the gas exhaust rate of the gas exhaust unit 46 is also maintained constant as mentioned above, and therefore, the flow rate of the purge gas corresponds to the internal pressure of the load-lock chamber 14 with a specific relationship. Accordingly, the main control unit 38 can control the flow rate of the purge gas to be greater than a predetermined value or within a predetermined range by using the pressure set value of the pressure control unit 72. However, for example, if the exhaust flow rate of the gas exhaust unit 46 decreases, the flow rate of the purge gas may be abnormally decreased even when the internal pressure of the load-lock chamber 14 is controlled as desired. In this case, since the main control unit 38 monitors the flow rate of the purge gas supplied into the load-lock chamber 14 from the purge gas supply source 30 through the flow rate sensor 74, if the flow rate of the purge gas becomes lower than the predetermined lower limit, e.g., 10 sccm, the main control unit 38 determines occurrence of an abnormality and then takes such actions as changing the pressure set value for the pressure control unit 72, giving an alarm and stopping the operation of the apparatus.

Figure 5:
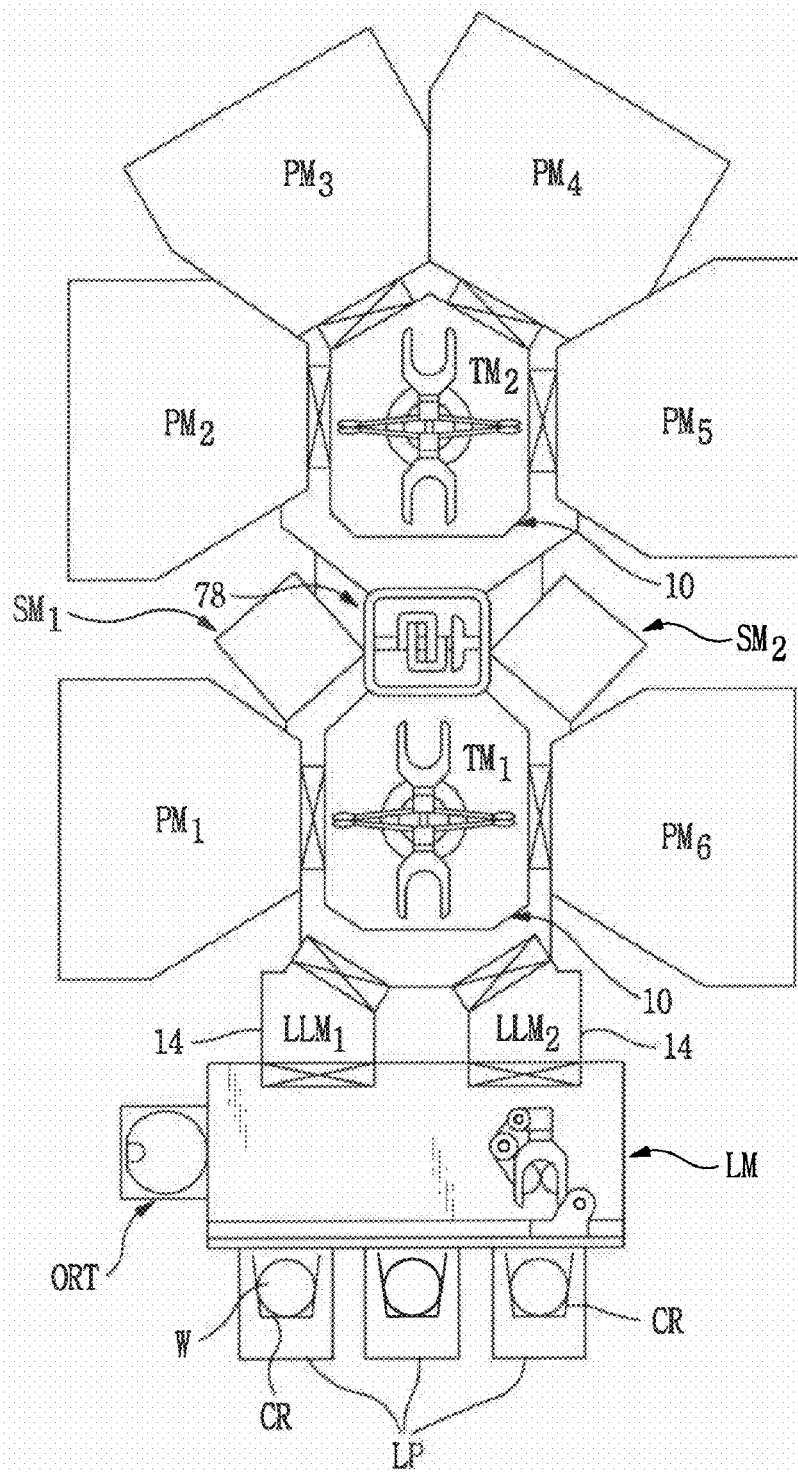
FIG. 5 shows a schematic plan view of a vacuum processing apparatus (cluster tool) in accordance with another embodiment of the present invention.

The vacuum processing apparatus of the cluster tool type in accordance with the above-described embodiments is not limited to that shown in FIG. 1, and the layout or the structure of each component can be changed in various ways. For example, as shown in FIG. 5, a single cluster tool can include two transfer modules $TM_1$ and $TM_2$ which are connected in series through a pass unit 78. In this configuration, maximum six process modules can be installed. Further, sub-modules $SM_1$ and $SM_2$ for pre-processing are installed at both sides of the pass unit 78. Furthermore, in this cluster tool, the vacuum transfer chamber 10 of each transfer module $TM_1$, $TM_2$ and the load-lock chamber 14 of each load-lock module $LLM_1$, $LLM_2$ can have the purge gas flow rate control mechanism and the pressure monitor mechanism (see, FIG. 2) or the pressure control mechanism and the purge gas flow rate monitor mechanism (see, FIG. 4) which have the same structures and functions as those in the aforementioned embodiments.

Moreover, in accordance with the above-described embodiments, the load-lock modules $LLM_1$ and $LLM_2$ are of a single-wafer type which temporarily stores a single semiconductor wafer W. Although not shown, the load-lock modules $LLM_1$ and $LLM_2$ can be configured as a batch type which temporarily stores a plurality of wafers W.

Further, although not shown, in accordance with still another embodiment, a vacuum processing apparatus has a vacuum transfer chamber coupled to a vacuum processing chamber via a gate valve, the vacuum transfer chamber being configured as a load-lock module in which a transfer robot is provided. That is, a load-lock chamber of the load-lock module can have the purge gas flow rate control mechanism and the pressure monitor mechanism (see, FIG. 2) or the pressure control mechanism and the purge gas flow rate monitor mechanism (see, FIG. 4) which have the same structures and functions as those in the aforementioned embodiments.

In such a case where the load-lock chamber is directly coupled to the vacuum transfer chamber, if a loader module LM is connected to the load-lock chamber via a door valve, a wafer mounting table to which both the transfer robot of the load-lock chamber and an atmospheric transfer robot $RB_2$ of the loader module LM can easily access is disposed (close to the door valve DV) in the load-lock chamber. Furthermore, the present invention can also be applied to a case where a cassette chamber is connected to the load-lock chamber via a door valve, and a wafer cassette CR is installed in the cassette chamber.

Moreover, the present invention can be applied to another vacuum processing apparatus other than a cluster tool. The vacuum process of the present invention is not limited to a CVD or dry etching method using reactive gases, and may include an exposure process under a reduced pressure condition.

Figure 6:
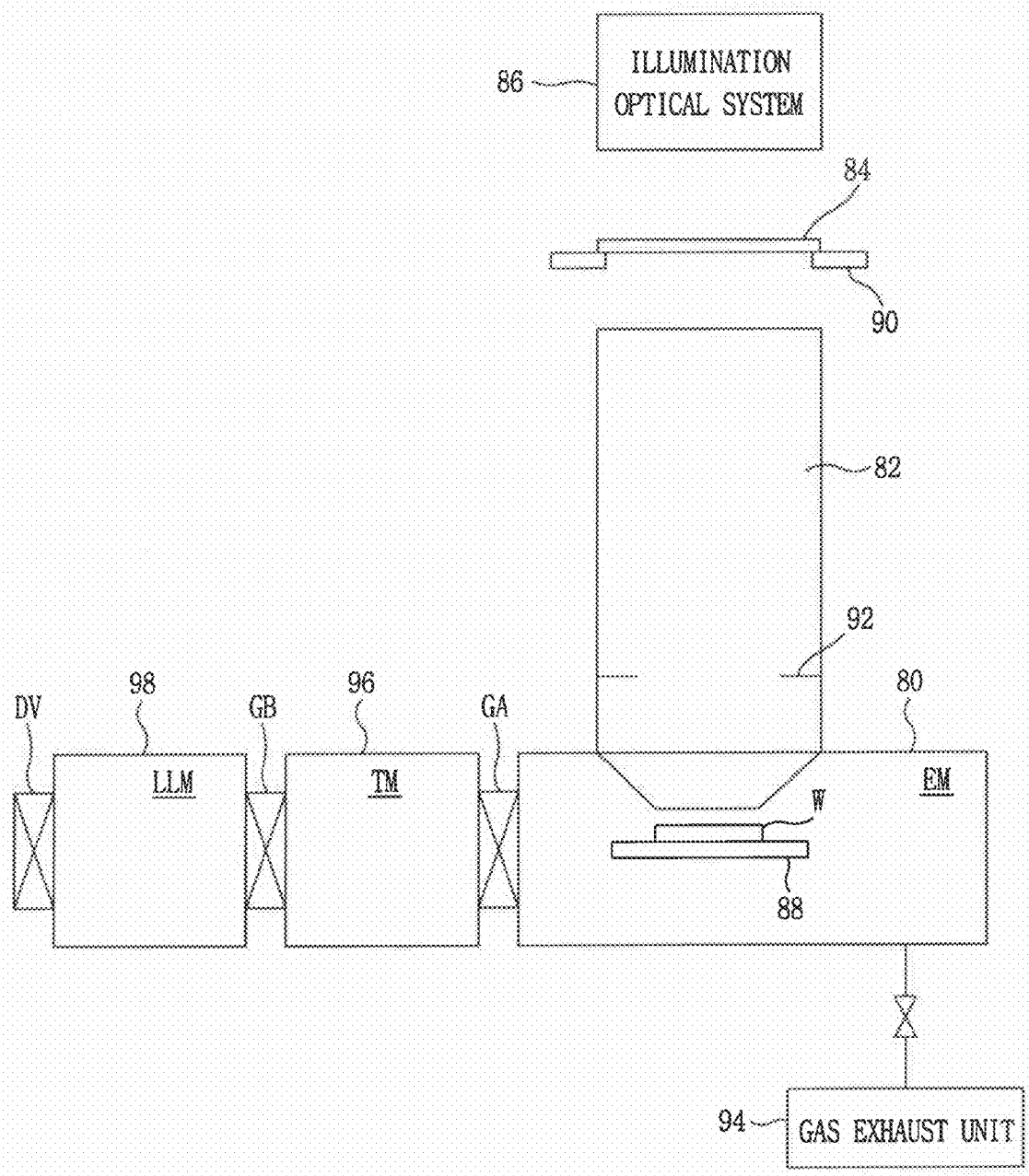
FIG. 6 is a block diagram showing main parts of an exposure device.

FIG. 6 is a configuration view showing main parts of a reduced pressure type exposure device. This exposure device includes an evacuable vacuum exposure chamber 80, a projection optical system 82 disposed above the vacuum exposure chamber 80, a reticle 84 disposed above the projection optical system 82, and an illumination optical system 86 disposed above the reticle 84.

A wafer W is horizontally mounted on a wafer stage 88 in the vacuum exposure chamber 80. The reticle 84 refers to a photomask where a pattern to be transcribed onto the wafer W is formed and the reticle 84 is horizontally supported by a reticle stage 90 of a ring shape. A variable iris diaphragm 92 is disposed in a middle position (around a pupil area) between the reticle 84 and the wafer stage 88. The illumination optical system 86 refers to, e.g., an ArF excimer laser, and illuminates the reticle 84 by so-called Kohler illumination in such a manner that a light source image is formed at the pupil area. The projection optical system 82 has a reduction projection lens formed of a plurality of optical lenses and it forms an image of the pattern of the reticle 84 which is Kohler illuminated from the above on the wafer W with a predetermined reduction ratio.

The vacuum exposure chamber 80 is supplied with an inert gas, e.g., He gas, from an inert gas supply unit (not shown) at a predetermined flow rate, while it is evacuated and maintained at a certain vacuum level by a gas exhaust unit 94. A vacuum transfer chamber 96 of a transfer module TM is connected to the vacuum exposure chamber 80 via a first gate valve GA, and a load-lock chamber 98 of a load-lock module LLM is connected to the transfer module TM via a second gate valve.

Figure 7:
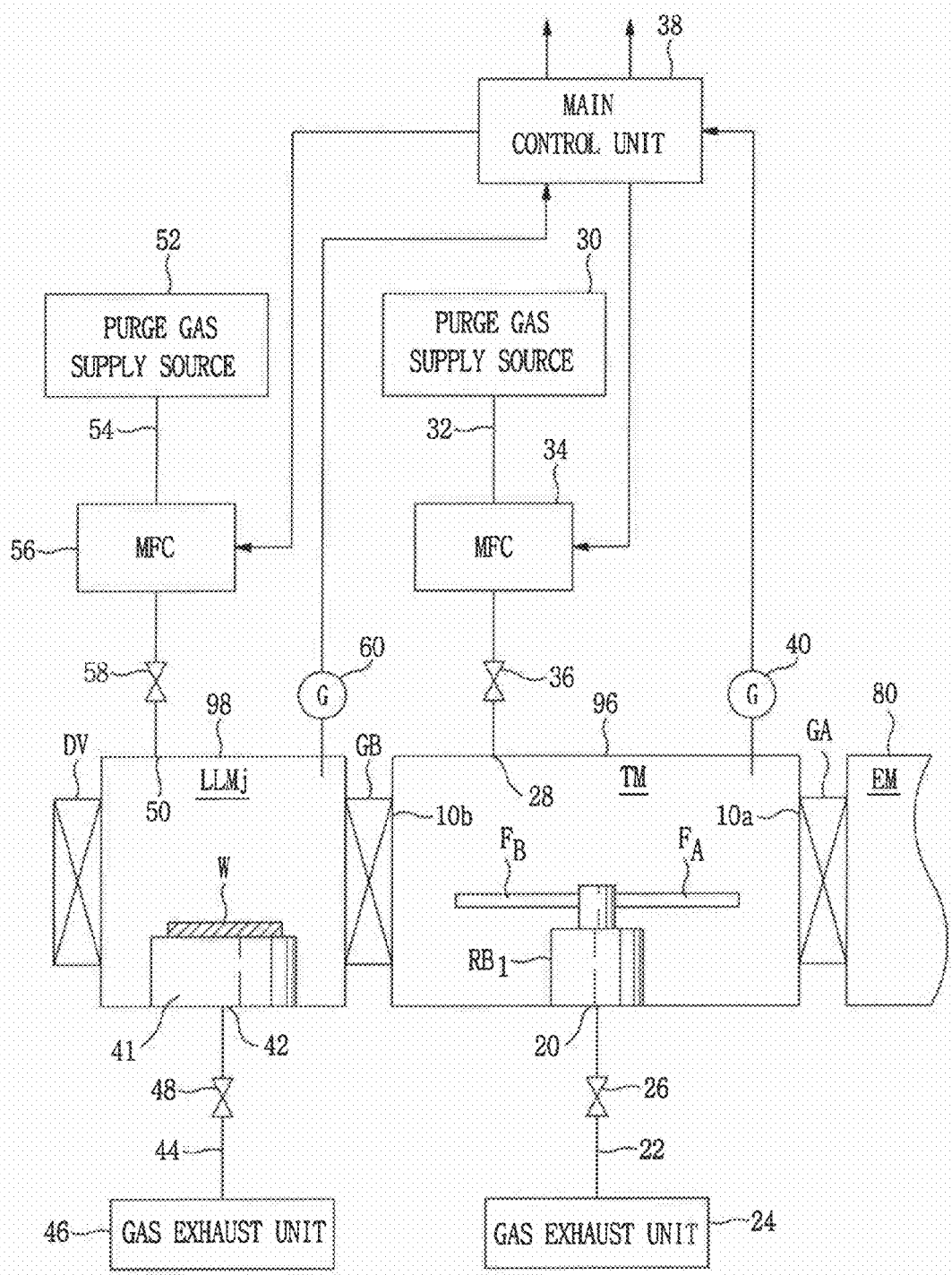
FIG. 7 is a block diagram showing a mechanism to individually control atmospheres in a vacuum transfer chamber and in a load-lock chamber of an exposure device in accordance with still another embodiment of the present invention.

In such an exposure device configured as described above, as shown in FIG. 7, the atmospheres in the vacuum transfer chamber 96 of the transfer module TM and in the load-lock chamber 98 of the load-lock module LLM can be controlled by the same atmosphere control mechanism as that of the aforementioned embodiment (see, FIG. 2) to thereby prevent organic contamination of each chamber 96 and 98. Further, although not shown, the same atmosphere control mechanism as that shown in FIG. 4 can also be used.

While the invention has been shown and described with respect to the preferred embodiments, it will be understood by those skilled in the art that various changes and modifications may be made without departing from the spirit and scope of the invention as defined in the following claims.

In accordance with the above-described embodiments, the gas exhaust rates of the gas exhaust units 24 and 46 for evacuating the vacuum transfer chamber 10 of the transfer module TM and the load-lock chamber 14 of each load-lock module $LLM_1$, $LLM_2$ are fixed constant. However, it is also possible to install an automatic pressure controller (APC) in the gas exhaust units 24 and 46, so that the gas exhaust rate is variably controlled by the APC to set the internal pressure of each chamber 10, 14 to a pressure set value. In this case, the purge gas supply mechanism can fix the flow rate of the purge gas at a constant level by using the flow rate control valve such as a throttle valve, and the MFC or the pressure control loop may be omitted. Moreover, the target object to be processed in the present invention is not limited to a semiconductor wafer and may be other objects which are possibly organic-contaminated in a vacuum processing apparatus, e.g., an LCD substrate.

In accordance with the vacuum processing apparatus and method of the present invention, organic contamination of the target object can be effectively reduced even though there are organic members or organic materials in the vacuum processing apparatus.

What is claimed is:

1. A vacuum processing apparatus comprising:
    a vacuum transfer chamber having a transfer unit for transferring a target object to and from an adjacent chamber, the inside of the vacuum transfer chamber being maintained at a depressurized state;
    a vacuum processing chamber, which is disposed adjacent to the vacuum transfer chamber, for performing a predetermined process on the target object under a reduced pressure;
    a gas exhaust unit for evacuating the vacuum transfer chamber;
    a purge gas supply unit for supplying a purge gas into the vacuum transfer chamber; and
    a control unit for controlling an internal pressure of the vacuum transfer chamber while monitoring whether or not a flow rate of the purge gas supplied into the vacuum transfer chamber from the purge gas supply unit is smaller than a lower limit of the flow rate,
    wherein the gas exhaust unit evacuates the vacuum transfer chamber at a constant gas exhaust rate so that the flow rate of the purge gas supplied into the vacuum transfer chamber corresponds to the internal pressure of the vacuum transfer chamber with a specific relationship,
    wherein the control unit is configured to change an internal pressure set value of the vacuum transfer chamber when the monitored flow rate of the purge gas is lower than the lower limit, and
    wherein the control unit is configured to control the internal pressure of the vacuum transfer chamber so that the internal pressure of the vacuum transfer chamber is set higher than that of the vacuum processing chamber.

2. The vacuum processing apparatus of claim 1, wherein the lower limit of the flow rate is set to 10 sccm or more and the internal pressure set value of the vacuum transfer chamber is set to 66.7 Pa (500 mTorr) or less.

3. The vacuum processing apparatus of claim 1, further comprising a load-lock chamber for temporarily storing the target object which is transferred between an atmospheric space and the vacuum transfer chamber, wherein the load-lock chamber is disposed adjacent to the vacuum transfer chamber, and an inside of the load-lock chamber is selectively changed into an atmospheric state or a depressurized state.

4. The vacuum processing apparatus of claim 1, wherein the vacuum transfer chamber is configured as a load-lock chamber, which includes the transfer unit therein and is capable of selectively changing an inside of the load-lock chamber into an atmospheric state or a depressurized state.

5. The vacuum processing apparatus of claim 1, wherein the lower limit of the flow rate is set to 10 sccm or more and the internal pressure set value of the vacuum transfer chamber is set to 26.7 Pa (200 mTorr).

6. A vacuum processing apparatus comprising:
    a vacuum transfer chamber having a transfer unit for transferring a target object to and from an adjacent chamber, the inside of the vacuum transfer chamber being maintained at a depressurized state;
    a vacuum processing chamber, which is disposed adjacent to the vacuum transfer chamber, for performing a predetermined process on the target object under a reduced pressure;
    a load-lock chamber for temporarily storing the target object which is transferred between an atmospheric space and the vacuum transfer chamber, the load-lock chamber being disposed adjacent to the vacuum transfer chamber and an inside of the load-lock chamber being selectively changed into an atmospheric state or a depressurized state;
    a gas exhaust unit for evacuating the load-lock chamber;
    a purge gas supply unit for supplying a purge gas into the load-lock chamber; and
    a control unit for controlling an internal pressure of the load-lock chamber while monitoring whether or not a flow rate of the purge gas supplied into the load-lock chamber from the purge gas supply unit is smaller than a lower limit of the flow rate,
    wherein the gas exhaust unit evacuates the load-lock chamber at a constant gas exhaust rate so that the flow rate of the purge gas supplied into the load-lock chamber corresponds to the internal pressure of the load-lock chamber with a specific relationship,
    wherein the control unit is configured to change an internal pressure set value of the load-lock chamber when the monitored flow rate of the purge gas is lower than the lower limit, and wherein the control unit is configured to control the internal pressure of the vacuum load-lock so that the internal pressure of the load-lock chamber is set higher than that of the vacuum transfer chamber.

7. The vacuum processing apparatus of claim 6, wherein the lower limit of the flow rate is set to 10 sccm or more and an internal pressure set value of the vacuum transfer chamber is set to 66.7 Pa (500 mTorr) or less.

8. The vacuum processing apparatus of claim 6, wherein the lower limit of the flow rate is set to 10 sccm or more and the internal pressure set value of the load-lock chamber is set to 53.4 Pa (400 mTorr).

* * * * *